United States Patent
Hoshino et al.

(10) Patent No.: US 10,472,478 B2
(45) Date of Patent: Nov. 12, 2019

(54) PREPREG, METAL-CLAD LAMINATE AND PRINTED WIRING BOARD

(71) Applicant: Panasonic Intellectual Property Management Co., Ltd., Osaka (JP)

(72) Inventors: Yasunori Hoshino, Osaka (JP); Shimpei Obata, Fukushima (JP); Shigetoshi Fujita, Fukushima (JP); Ryuji Takahashi, Fukushima (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/755,768

(22) PCT Filed: Sep. 5, 2016

(86) PCT No.: PCT/JP2016/004035
§ 371 (c)(1),
(2) Date: Feb. 27, 2018

(87) PCT Pub. No.: WO2017/047033
PCT Pub. Date: Mar. 23, 2017

(65) Prior Publication Data
US 2018/0327559 A1    Nov. 15, 2018

(30) Foreign Application Priority Data
Sep. 15, 2015   (JP) .................................. 2015-181535

(51) Int. Cl.
*C08L 63/00* (2006.01)
*C08L 51/04* (2006.01)
(Continued)

(52) U.S. Cl.
CPC ...... *C08J 5/24* (2013.01); *C08K 3/00* (2013.01); *C08K 3/36* (2013.01); *C08L 33/08* (2013.01);
(Continued)

(58) Field of Classification Search
CPC ........... C08J 5/24; H05K 1/03; H05K 1/0353; H05K 1/0366; H05K 1/0373;
(Continued)

(56) References Cited

U.S. PATENT DOCUMENTS

| | | | | |
|---|---|---|---|---|
| 4,954,195 A | * | 9/1990 | Turpin | ................. B29C 70/025 156/242 |
| 6,287,696 B1 | * | 9/2001 | Noda | ......................... C08J 5/24 428/366 |

(Continued)

FOREIGN PATENT DOCUMENTS

| JP | 8-309920 | 11/1996 |
|---|---|---|
| JP | 10-296911 | 11/1998 |

(Continued)

OTHER PUBLICATIONS

International Search Report of PCT application No. PCT/JP2016/004035 dated Sep. 27, 2016.

*Primary Examiner* — Roshn K Varghese
(74) *Attorney, Agent, or Firm* — McDermott Will & Emery LLP

(57) ABSTRACT

A prepreg includes: a woven fabric base; and a semi-cured product of a resin composition, which fills an inside of the woven fabric base and coats a surface of the woven fabric base. The resin composition includes a thermosetting resin, an inorganic filler, a first thermoplastic resin soluble in an organic solvent, and a second thermoplastic resin insoluble in an organic solvent. With respect to 100 parts by mass of the thermosetting resin, a content ratio of the inorganic filler ranges from 50 parts by mass to 150 parts by mass, inclusive, and a total content ratio of the first thermoplastic resin and the second thermoplastic resin ranges from 20 parts by mass to 50 parts by mass, inclusive.

5 Claims, 2 Drawing Sheets

(51) Int. Cl.
*C08L 33/08* (2006.01)
*C08J 5/24* (2006.01)
*C08K 3/00* (2018.01)
*C08L 101/00* (2006.01)
*H05K 1/03* (2006.01)
*C08K 3/36* (2006.01)

(52) U.S. Cl.
CPC ............. *C08L 63/00* (2013.01); *C08L 101/00* (2013.01); *H05K 1/03* (2013.01); *H05K 1/0353* (2013.01); *C08J 2363/00* (2013.01); *C08J 2433/08* (2013.01); *C08J 2451/04* (2013.01); *C08L 51/04* (2013.01); *H05K 1/0366* (2013.01); *H05K 1/0373* (2013.01); *H05K 2201/0129* (2013.01)

(58) Field of Classification Search
CPC ... H05K 2201/0129; C08K 3/00; C08L 33/08; C08L 51/04; C08L 101/00; C08L 63/00; C08G 59/38
See application file for complete search history.

(56) References Cited

U.S. PATENT DOCUMENTS

| | | | |
|---|---|---|---|
| 9,382,369 B2 * | 7/2016 | Chang | C08L 69/00 |
| 2010/0096173 A1 * | 4/2010 | Fujino | C08G 59/50 |
| | | | 174/258 |
| 2011/0244183 A1 | 10/2011 | Goto et al. | |
| 2014/0288240 A1 * | 9/2014 | Hsieh | C08L 79/00 |
| | | | 525/133 |
| 2015/0163901 A1 * | 6/2015 | Nishioka | H01L 23/145 |
| | | | 174/251 |
| 2016/0017141 A1 | 1/2016 | Matsumoto et al. | |
| 2016/0251510 A1 * | 9/2016 | Furukawa | C08F 279/02 |
| | | | 523/201 |

FOREIGN PATENT DOCUMENTS

| | | |
|---|---|---|
| JP | 11-298152 | 10/1999 |
| JP | 2008-133329 | 6/2008 |
| JP | 2009-074036 | 4/2009 |
| WO | 2010/035452 | 4/2010 |
| WO | 2014/132654 | 9/2014 |

* cited by examiner

PREPREG, METAL-CLAD LAMINATE AND PRINTED WIRING BOARD

This application is a U.S. national stage application of the PCT International Application No. PCT/JP2016/004035 filed on Sep. 5, 2016, which claims the benefit of foreign priority of Japanese patent application 2015-181535 filed on Sep. 15, 2015, the contents all of which are incorporated herein by reference.

TECHNICAL FIELD

The present disclosure relates to a prepreg, a metal-clad laminate, and a printed wiring board.

BACKGROUND

In recent years, with rapid development of electronics technology, reduction in thickness and size for electronic devices has been advanced, and accordingly, circuit patterns of printed wiring boards have progressively become finer. As a method for forming fine circuit patterns, a subtractive method, a semi-additive method, a full-additive method and the like are commonly known. Above all, in view of being able to make circuit patterns finer, the semi-additive method has been attracting attention. In accordance with the semi-additive method, fine circuit patterns are formed by the following procedures in general. The procedures are, forming a thin electroless plating layer on an insulating layer by electroless plating, protecting a non-circuit forming part with a plating resist, then, depositing a thick electrolytic plating layer on a circuit forming part by electrolytic plating, thereafter, removing the resist, and etching the electroless plating layer other than the circuit forming part.

As just described, in accordance with the semi-additive method, the electroless plating layer is used as a seed layer, thus adhesion strength between the insulating layer and the circuit patterns is low. Therefore, there is a need to ensure high adhesion. In addition, there is a need to conduct a reflow process in a substrate working process. Thus, in order to suppress generation of defects such as delamination during the reflow process, there is a need to ensure excellent hygroscopic heat resistance.

On the other hand, International Publication No. WO 2014/132654 discloses a resin composition for a printed wiring board, which contains a thermosetting resin including an epoxy resin, a curing agent, an inorganic filler, and an expansion relief component composed of an acrylic resin soluble in an organic solvent, and has a melt viscosity of less than 50000 Ps at 130° C. Furthermore, International Publication No. WO 2014/132654 specifically discloses use of a predetermined acrylic acid ester polymer as the expansion relief component soluble in an organic solvent.

In addition, International Publication No. WO 2010/035452 discloses a resin composition containing an epoxy resin, a curing agent, a silica component of silica particles subjected to a surface treatment with a silane coupling agent, and an imidazole-silane compound.

SUMMARY

A prepreg according to the present disclosure includes: a woven fabric base; and a semi-cured product of a resin composition, which fills an inside of the woven fabric base and coats a surface of the woven fabric base. The resin composition includes a thermosetting resin, an inorganic filler, a first thermoplastic resin soluble in an organic solvent, and a second thermoplastic resin insoluble in an organic solvent. With respect to 100 parts by mass of the thermosetting resin, a content ratio of the inorganic filler ranges from 50 parts by mass to 150 parts by mass, inclusive and a total content ratio of the first thermoplastic resin and the second thermoplastic resin ranges from 20 parts by mass to 50 parts by mass, inclusive.

In addition, in the prepreg, the first thermoplastic resin is preferably a copolymer of an acrylic monomer and the second thermoplastic resin is preferably a core-shell rubber.

In addition, in the prepreg, a content ratio of the first thermoplastic resin to the second thermoplastic resin is preferably in a range from 30:70 to 70:30, inclusive, expressed by a mass ratio of the first thermoplastic resin to the second thermoplastic resin.

In addition, in the prepreg, the inorganic filler is preferably at least one selected from a group consisting of silica, alumina, and boehmite.

A metal-clad laminate according to the present disclosure includes: an insulating layer including a cured product of the prepreg described above; and a metal foil provided on at least one surface of the insulating layer.

A printed wiring board according to the present disclosure includes: an insulating layer including a cured product of the prepreg described above; and a circuit pattern provided at least one surface of the insulating layer, the circuit pattern including an electroless plating layer and an electrolytic plating layer formed on the electroless plating layer.

According to the present disclosure, fine circuit patterns can be formed with use of a semi-additive method, while ensuring excellent hygroscopic heat resistance and high adhesion to the circuit patterns.

DESCRIPTION OF EMBODIMENTS

Before describing exemplary embodiments of the present disclosure, a problem in a conventional printed wiring substrate will be briefly described. For the resin composition described in International Publication No. WO 2014/132654, the acrylic acid ester copolymer is, as a thermoplastic component soluble in an organic solvent, added to the thermosetting resin including the epoxy resin. Thus, it is possible to improve adhesion between an insulating layer composed of a cured product of the resin composition and circuit patterns. However, the acrylic acid ester copolymer is highly hygroscopic, and thus, when an additive amount of the acrylic acid ester copolymer to the thermosetting resin is increased, there is a possibility that hygroscopic heat resistance of a printed wiring board obtained will be decreased, thereby failing to achieve sufficient hygroscopic heat resistance.

In addition, for the resin composition described in International Publication No. WO 2010/035452, the imidazole-silane compound is added to the epoxy resin. Thus, it is possible to improve adhesion between an insulating layer and circuit patterns. However, the insulating layer composed of a cured product of the resin composition has a low glass transition temperature (Tg), and has a possibility of failing to achieve sufficient hygroscopic heat resistance.

The present disclosure has been made in view of the points described above, and provides a prepreg, a metal-clad laminate, and a printed wiring board which allow formation of fine circuit patterns with use of a semi-additive method, while ensuring excellent hygroscopic heat resistance and high adhesion to the circuit patterns.

Exemplary embodiments of the present disclosure (hereinafter, referred to as the present exemplary embodiments) will be described below.

[Prepreg]

Figure 1:
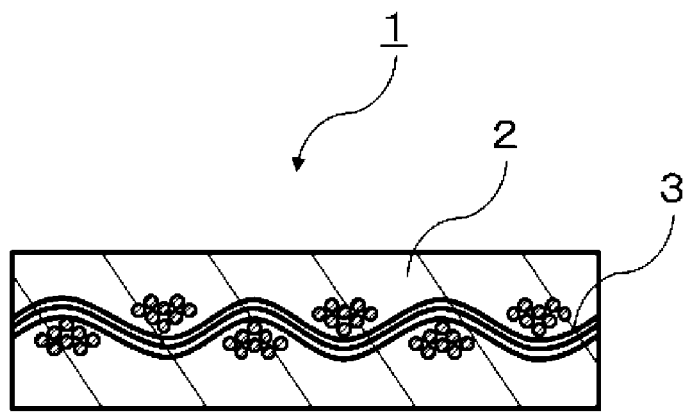
FIG. 1 is a schematic sectional view illustrating a prepreg according to an exemplary embodiment.

FIG. 1 is a schematic sectional view illustrating a prepreg according to an exemplary embodiment. Prepreg 1 includes: woven fabric base 3; and a semi-cured product of resin composition 2, which fills an inside of woven fabric base 3 and coats a surface of woven fabric base 3.

<Resin Composition>

Resin composition 2 (hereinafter, may be referred to as a resin composition for a printed wiring board) includes a thermosetting resin (a), an inorganic filler (b), a thermoplastic resin (c) soluble in an organic solvent, and a thermoplastic resin (d) insoluble in an organic solvent. As for content ratios of the thermosetting resin (a), the inorganic filler (b), the thermoplastic resin (c) soluble in an organic solvent, and the thermoplastic resin (d) insoluble in an organic solvent, with respect to 100 parts by mass of the thermosetting resin (a), a content ratio of the inorganic filler (b) ranges from 50 parts by mass to 150 parts by mass, inclusive, and a total content ratio of the thermoplastic resin (c) and the thermoplastic resin (d) ranges from 20 parts by mass to 50 parts by mass, inclusive. According to the present exemplary embodiment, the thermosetting resin (a) used in combination with the thermoplastic resin (c) soluble in an organic solvent and the thermoplastic resin (d) insoluble in an organic solvent contains the thermoplastic resin (c) and the thermoplastic resin (d) at predetermined ratios. And thus, a cured product of the thermosetting resin (a) can be provided with both high adhesion to fine circuit patterns formed by a semi-additive method and excellent hygroscopic heat resistance. Therefore, the resin composition is preferred, in particular, as a material for use in a semi-additive method.

In the present exemplary embodiment, the thermosetting resin (a) corresponds to an example of the "thermosetting resin", the inorganic filler (b) corresponds to an example of the "inorganic filler", and the thermoplastic resin (c) corresponds to the "first thermoplastic resin", and the thermoplastic resin (d) corresponds to the "second thermoplastic resin".

<Thermosetting Resin (a)>

It is preferable to use, as the thermosetting resin (a), a resin including an epoxy resin. The thermosetting resin (a) may be a mixture including an epoxy resin and a thermosetting resin other than the epoxy resin, or include only an epoxy resin.

The epoxy resin mentioned above is not particularly limited as long as the epoxy resin is used for forming various types of substrate materials for printed wiring boards. Specific examples of the epoxy resin include a naphthalene-type epoxy resin, a cresol novolac-type epoxy resin, a bisphenol A type epoxy resin, a bisphenol F type epoxy resin, a bisphenol S type epoxy resin, an alicyclic epoxy resin, an aliphatic chain epoxy resin, a phenol novolac-type epoxy resin, an alkyl phenol novolac-type epoxy resin, an aralkyl-type epoxy resin, a biphenol-type epoxy resin, a dicyclopentadiene-type epoxy resin, a trishydroxyphenylmethane-type epoxy resin, an epoxidized product of a condensation product of a phenol with an aromatic aldehyde having a phenolic hydroxyl group, a diglycidyl-etherified product of bisphenol, a diglycidyl-etherified product of naphthalenediol, a glycidyl-etherified product of a phenol, a diglycidyl-etherified product of an alcohol, and triglycidylisocyanurate. In addition, besides the foregoing listed, various types of diglycidyl ether-type epoxy resins, diglycidyl amine-type epoxy resins, diglycidyl ester-type epoxy resins, and oxidized epoxy resins may be used, and additionally, it is possible to use phosphorus-modified epoxy resins. One of the epoxy resins may be used alone, or two or more of the resins may be used in combination. In particular, from the perspective of excellent curing property, it is preferable to use an epoxy resin that has two or more epoxy groups in one molecule.

When a thermosetting resin other than the epoxy resin mentioned above is included in the thermosetting resin (a), a type of the thermosetting resin other than the epoxy resin is not particularly limited, and examples of the thermosetting resin include a multi-functional cyanic acid ester resin, a multi-functional maleimide-cyanic acid ester resin, a multi-functional maleimide resin, an unsaturated polyphenylene ether resin, a vinyl ester resin, a urea resin, a diallylphthalate resin, a melanin resin, a guanamine resin, an unsaturated polyester resin, a melanin-urea co-condensation resin, and a phenolic resin. One of the thermosetting resins other than the epoxy resin may be used alone, or two or more of the resins can be used in combination.

<Inorganic Filler (b)>

A type of the inorganic filler (b) is not particularly limited, and examples of the inorganic filler (b) include silica, barium sulfate, silicon oxide powder, crushed silica, fired talc, zinc molybdate-treated talc, barium titanate, titanium oxide, clay, alumina, mica, boehmite, zinc borate, zinc stannate, and other metal oxides and metal hydrates, and besides, aluminum hydroxide, calcium carbonate, magnesium hydroxide, magnesium silicate, a short glass fiber, an aluminum borate whisker, and a silicon carbonate whisker. One of the inorganic fillers may be used alone, or two or more of the fillers may be used in combination. Above all, in terms of chemical resistance, the inorganic filler is preferably at least one selected from silica, alumina, and boehmite. In addition, a shape and particle size of the inorganic filler (b) are not particularly limited, but the particle size of the inorganic filler (b) preferably ranges from 0.02 µm to 2.0 µm, inclusive, more preferably from 0.02 µm to 0.5 µm, inclusive. In addition, it is also possible to use inorganic fillers that differ in particle size in combination. From the perspective of highly filling with the inorganic filler (b), for example, an inorganic filler of 1 µm or more in particle size may be used in combination with a microscopic inorganic filler on the order of nanometers less than 1 µm. In addition, the inorganic filler (b) may be subjected to a surface treatment with a coupling agent or the like. In this regard, the particle size of the inorganic filler (b) can be obtained as a median diameter (d50, on a volumetric basis) in a cumulative distribution from measurement values of a particle size distribution obtained by a laser diffraction scattering method with use of a commercially available laser diffraction scattering-type particle size distribution measurement apparatus.

<Thermoplastic Resin (c) Soluble in Organic Solvent>

The thermoplastic resin (c) is soluble in an organic solvent. And unlike acrylic rubber particles or the like, the thermoplastic resin (c) is compatible with the thermosetting resin (a) when the thermoplastic resin (c) is mixed with an organic solvent and thus prepared as resin composition 2 in a form of a varnish for a printed wiring board (hereinafter, may be referred to as a resin varnish). As just described, the thermoplastic resin (c) is made compatible with the thermosetting resin (a), thereby it is possible to provide a printed wiring board which has excellent adhesion to a fine circuit pattern formed by a semi-additive method. It is noted that the phrase of "soluble in an organic solvent" means that the resin is uniformly dispersed in the solvent without becoming cloudy in the case of 10 mass % addition to the thermosetting resin (a).

The thermoplastic resin (c) preferably exerts an action of relieving thermal expansion (expansion relief action) when stress due to the expansion is applied in a cured product of resin composition 2 for a printed wiring board. And specific examples of the thermoplastic resin (c) may include a copolymer of an acrylic monomer.

The copolymer of the acrylic monomer refers to a polymer formed by molecules including at least repeating constituent units derived from an acrylic acid ester (acrylic acid ester units). The repeating constituent units derived from an acrylic acid ester mean repeating constituent units formed in the polymerization of an acrylic acid ester monomer. The copolymer of the acrylic monomer may include, in molecules, repeating constituent units derived from multiple different kinds of acrylic acid esters, and furthermore, repeating constituent units derived from monomers other than acrylic acid esters. Alternatively, the copolymer of the acrylic monomer may be composed of repeating constituent units derived from multiple different kinds of acrylic acid esters. Alternatively, the copolymer of the acrylic monomer may be a copolymer including repeating constituent units derived from one kind of acrylic acid ester and repeating constituent units derived from a monomer other than acrylic acid esters.

In the acrylic acid esters, examples of a substituent directly linked to carbon in an ester bond include an alkyl group and a substituted alkyl group (that is, an alkyl group where any of hydrogen atoms is substituted with another functional group). When the substituent is an alkyl group, the alkyl group may be linear or branched, or may be an alicyclic alkyl group. Besides, the substituent mentioned above may be aromatic. Specific examples of the acrylic acid esters include, but are not limited thereto, methyl acrylate, ethyl acrylate, propyl acrylate, isopropyl acrylate, butyl acrylate, isobutyl acrylate, t-butyl acrylate, pentyl acrylate, hexyl acrylate, cyclohexyl acrylate, octyl acrylate, decyl acrylate, lauryl acrylate, and benzyl acrylate.

An example of the monomer other than the acrylic acid esters mentioned above includes acrylonitrile. In addition, besides the foregoing, the examples include vinyl monomers other than the acrylic acid esters, such as acrylamide, acrylic acid, methacrylic acid, methacrylic acid ester, styrene, ethylene, propylene, and butadiene. The copolymer of the acrylic monomer may include repeating constituent units derived from two or more different monomers other than the acrylic acid esters.

The repeating constituent units constituting the copolymer of the acrylic monomer may be randomly arranged (that is, may be a random copolymer), or may be a so-called a block copolymer composed as a block for the same type of repeating constituent unit. In addition, the copolymer of the acrylic monomer may be a branched graft copolymer or a cross-linked copolymer, as long as advantageous effects of the present disclosure are not blocked.

The copolymer of the acrylic monomer can be obtained, for example, by radical polymerization of a predetermined monomer, but the disclosure is not limited to such a production method.

The copolymer of the acrylic monomer may further have a functional group at an end, a side chain, or a main chain of the polymer molecule. In particular, when the thermosetting resin (a) is an epoxy resin, the functional group is preferably a functional group that has reactivity with the epoxy resin. Examples of such a functional group include an epoxy group, a hydroxyl group, a carboxyl group, an amino group, and an amide group. The functional group mentioned above is bonded to the copolymer of the acrylic monomer, thereby, for example, allowing the group to react with a component included in resin composition 2 for a printed wiring board, and then incorporated in a curable structure of the thermosetting resin (a), thus making it possible to expect improvements in heat resistance, compatibility, chemical resistance, and the like. Among the functional groups listed above, an epoxy group is particularly preferred. The copolymer may have a plurality of functional groups per polymer molecule. It is noted that inclusion of the functional group as mentioned above is also referred to as being modified with the functional group as mentioned above, and for example, inclusion of an epoxy resin is also referred to as an epoxy modification.

In particular, the copolymer of the acrylic monomer preferably has such a molecular structure with rubber elasticity, and in this case, an effect of the expansion relief action can be further enhanced. For example, a copolymer of an acrylic monomer, which includes repeating constituent units derived from butyl acrylate and repeating constituent units derived from acrylonitrile, comes with rubber elasticity. In addition, besides, when a copolymer includes repeating constituent units derived from butadiene, the copolymer comes with rubber elasticity.

The thermoplastic resin (c) is soluble in an organic solvent, and homogeneously mixed with the thermosetting resin (a) when an organic solvent is mixed to prepare a resin varnish. The thermoplastic resin (c) may be, in a form of a solid, dissolved in an organic solvent in the preparation of a resin varnish and used. Or the thermoplastic resin (c) may be used in a form of a liquid dissolved in advance in an organic solvent. As just described, when the thermoplastic resin (c) is dissolved in an organic solvent and then homogeneously mixed with the thermosetting resin (a), the expansion relief action mentioned above is believed to be more easily exerted. And separation between the resin component and the inorganic filler (b) is believed to be more easily inhibited in a fluid state during hot forming.

By including the thermoplastic resin (c) in resin composition 2 for a printed wiring board, it becomes easy to properly control viscosity of resin composition 2 for a printed wiring board. Therefore, in a substrate material (prepreg 1 or metal-clad laminate 11) formed from resin composition 2 for a printed wiring board, separation between the resin component derived from resin composition 2 for a printed wiring board and the inorganic filler (b) is less likely to be caused. Thus, formability of the substrate material can be improved. In addition, the thermoplastic resin (c) is included in resin composition 2 for a printed wiring board, thereby it is also possible to reduce the coefficient of thermal expansion (CTE) for prepreg 1. This is because the expansion relief action mentioned above is exerted, thereby causing the thermoplastic resin (c) to absorb thermal expansions. In particular, when the thermoplastic resin (c) is the above-mentioned copolymer of the acrylic monomer, the formability can be further improved, and the CTE is more likely to be reduced.

A molecular weight of the copolymer of the acrylic monomer is not particularly limited, but a weight-average molecular weight (Mw) preferably ranges from $10\times10^4$ to $90\times10^5$, inclusive, from the perspective of balance among the solubility in an organic solvent, the expansion relief action, and ease of adjusting a melt viscosity of resin composition 2 for a printed wiring board. As long as the weight-average molecular weight (Mw) falls within the range mentioned above, the expansion relief action is more likely to be exerted, and favorable formability during hot forming is more likely to be ensured. More preferably, the weight-average molecular weight (Mw) ranges from $10\times10^4$ to $50\times10^5$, inclusive. As just described, use of the lower-molecular-weight copolymer of the acrylic monomer can reduce the melt viscosity of resin composition 2 for a printed wiring board even when the copolymer contains therein a large amount of the inorganic filler (b), as compared with a case of using a higher-molecular weight copolymer of an acrylic monomer such as in excess of $50\times10^5$. It is noted that the weight-average molecular weight herein refers to a value measured in terms of polystyrene, for example, by gel permeation chromatography.

<Thermoplastic Resin (d) Insoluble in Organic Solvent>

The thermoplastic resin (d) is insoluble in an organic solvent. And the thermoplastic resin (d) is incompatible with the thermosetting resin (a) and the thermoplastic resin (c) (hereinafter, may be referred to as other resin components) when an organic solvent is mixed for a preparation as a resin varnish. Therefore, the thermoplastic resin (d) will be dispersed in the other resin components, thereby producing a stress relief effect. Thus, it is possible to provide a printed wiring board which is excellent in hygroscopic heat resistance. It is noted that the phrase of "insoluble in an organic solvent" means that the solution becomes cloudy without being uniformly dispersed in the case of 10 mass % addition to the resin composition.

An example of the thermoplastic resin (d) includes a core-shell particle.

The core-shell particle is a composite material that includes different materials respectively in an inner core part and an outer shell part. A rubber component present in the core part is preferably a highly heat-resistant rubber, and above all, a silicon rubber, an acrylic rubber, a butadiene rubber, or the like. The shell part is a part that is compatible with the thermosetting resin (a), and specifically, is preferably an organic layer such as a graft polymer.

A particle size of the core-shell particle preferably ranges from 0.02 μm to 2.0 μm, inclusive, more preferably from 0.02 μm to 1.0 μm, inclusive. In this regard, the particle size of the core-shell particle can be obtained as a median diameter (d50, on a volumetric basis) in a cumulative distribution from measurement values of a particle size distribution obtained by a laser diffraction scattering method with use of a commercially available laser diffraction scattering-type particle size distribution measurement system.

<Content Ratio>

A content ratio of the inorganic filler (b) ranges from 50 parts by mass to 150 parts by mass, inclusive, preferably from 50 parts by mass to 100 parts by mass, inclusive, with respect to 100 parts by mass of the thermosetting resin (a). If the content ratio of the inorganic filler (b) is less than 50 parts by mass, there is a possibility of failing to provide a printed wiring board which is excellent in hygroscopicity and heat resistance. In addition, if the content ratio of the inorganic filler (b) exceeds 150 parts by mass, there is a possibility of failing to provide a printed wiring board which is excellent in adhesion to a fine circuit pattern formed by a semi-additive method.

A total content ratio of the thermoplastic resin (c) and the thermoplastic resin (d) ranges from 20 parts by mass to 50 parts by mass, inclusive, preferably from 20 parts by mass to 40 parts by mass, inclusive, with respect to 100 parts by mass of the thermosetting resin (a). If the total content ratio of the thermoplastic resin (c) and the thermoplastic resin (d) is less than 20 parts by mass, there is a possibility of failing to provide a printed wiring board which is excellent in adhesion to a fine circuit pattern formed by a semi-additive method. In addition, if the total content ratio of the thermoplastic resin (c) and the thermoplastic resin (d) exceeds 50 parts by mass, there is a possibility of causing separation of the thermosetting resin (a), the thermoplastic resin (c), and the thermoplastic resin (d) in the resin varnish.

A content ratio of the thermoplastic resin (c) to the thermoplastic resin (d) preferably ranges from 30:70 to 70:30, more preferably from 40:60 to 60:40, expressed by a mass ratio of the first thermoplastic resin to the second thermoplastic resin [the mass of the thermoplastic resin (c):the mass of the thermoplastic resin (d)]. As long as the content ratio falls within the range mentioned above, a printed wiring board which is excellent in hygroscopicity and heat resistance and in formability, and further excellent in adhesion to a fine circuit pattern formed by a semi-additive method can be provided.

A content ratio of the thermoplastic resin (c) preferably ranges from 28 parts by mass to 70 parts by mass, inclusive, with respect to 100 parts by mass of the inorganic filler (b). As long as the content ratio of the thermoplastic resin (c) falls within the range mentioned above, a printed wiring board which further excellent in adhesion to a fine circuit pattern formed by a semi-additive method can be provided.

<Organic Solvent>

Resin composition 2 for a printed wiring board may contain an organic solvent in a form of a varnish. Examples of the organic solvent include ketone solvents such as acetone, methyl ethyl ketone, and cyclohexanone, aromatic solvents such as toluene and xylene, and ester solvents such as ethyl acetate, and one of the solvents may be used alone, or two or more of the solvents may be used in combination.

A content proportion of the organic solvent is preferably a proportion such that a non-volatile content (solid content) in resin composition 2 for a printed wiring board ranges from 50 mass % to 70 mass %, inclusive.

<Other Components>

Resin composition 2 for a printed wiring board may contain, in addition to the thermosetting resin (a), the inorganic filler (b), the thermoplastic resin (c), and the thermoplastic resin (d), other components, if necessary, as long as the advantageous effect of the present disclosure is not blocked. For example, a curing agent, a solvent for dilution, a curing accelerator such as imidazole, an antioxidant, a moistening dispersant and a coupling agent for improving mixing performance of the inorganic filler (b), a light stabilizer, a viscosity modifier, a flame retardant, a colorant, a defoaming agent, and the like may be blended as the other components. Examples of the curing agent mentioned above include bifunctional or polyfunctional phenol resins such as a novolac-type phenol resin and a naphthalene-type phenol resin. Examples of the above-mentioned solvent for dilution include nitrogen-containing solvents such as dimethylformamide.

Resin composition 2 for a printed wiring board can be prepared by blending, in an organic solvent, the thermosetting resin (a), the inorganic filler (b), the thermoplastic resin (c), and the thermoplastic resin (d), and other components such as an additive added appropriately, if necessary, with one another.

<Woven Fabric Base>

Woven fabric base 3 is not particularly limited, but may be a substrate in which a warp thread and a weft thread are woven so as to be almost perpendicular to each other, like a plain-woven fabric or the like. For example, the fabric substrate may be a fabric made of inorganic fibers such as glass cloth or a fabric made of organic fibers such as aramid cloth and polyester cloth. A thickness of woven fabric base 3 is not particularly limited, but preferably ranges from 10 µm to 200 µm, inclusive.

Prepreg 1 can be formed by, for example, impregnating woven fabric base 3 with resin composition 2 for a printed wiring board, and drying this by heating until resin composition 2 for a printed wiring board reaches to a semi-cured state (B-stage state). A condition in temperature and heating time for the semi-cured state can ranges, for example, from 120° C. to 190° C., inclusive, for the temperature and from 3 minutes to 15 minutes, inclusive, for the heating time.

[Metal-Clad Laminate]

Figure 2:
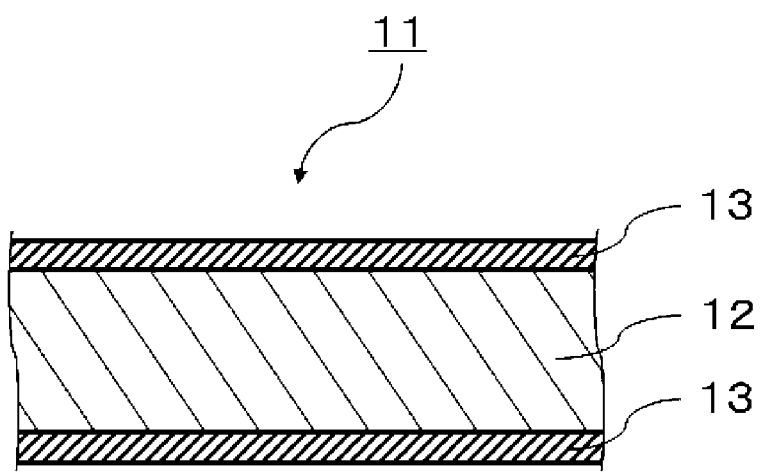
FIG. 2 is a schematic sectional view illustrating a metal-clad laminate according to an exemplary embodiment.

FIG. 2 is a schematic sectional view illustrating a metal-clad laminate according to an exemplary embodiment. Metal-clad laminate 11 includes insulating layer 12 composed of a cured product of prepreg 1, and metal foil 13 disposed on one or both surfaces of insulating layer 12. More specifically, the configuration of metal-clad laminate 11 is a two-layer configuration constituted of insulating layer 12 and metal foil 13 disposed on one surface of insulating layer 12, or a three-layer configuration constituted of insulating layer 12 and metal foil 13 disposed on both surfaces of insulating layer 12.

A thickness of metal-clad laminate 11 is not particularly limited, but preferably ranges from 20 µm to 400 µm, inclusive.

Examples of metal foil 13 include copper foil, silver foil, aluminum foil, and stainless-steel foil. A thickness of metal foil 13 is not particularly limited, but preferably ranges from 1.5 µm to 12 µm, inclusive.

A ten-point average roughness Rz of a surface of metal foil 13 which faces insulating layer 12 is not particularly limited, but preferably ranges from 0.5 µm to 2.0 µm, inclusive. Thus, metal foil 13 is dissolved and removed by, for example, etching, thereby providing insulating layer 12 with, at a surface of insulating layer 12, microscopic irregularities formed by transfer of irregularities at a mat surface of metal foil 13. In manufacturing printed wiring board 21 (see FIG. 3) by a semi-additive method with use of insulating layer 12, an anchor effect makes electroless plating layer 14a (hereinafter, may be referred to as a seed layer) more likely to adhere closely to insulating layer 12. Thus, it is possible to enhance adhesion between insulating layer 12 and circuit pattern 14.

Metal-clad laminate 11 can be fabricated by stacking metal foil 13 on one or both surfaces of prepreg 1 or on one or both surfaces of a plurality of prepregs 1 stacked, and integrally laminating metal foil 13 and prepreg(s) 1 through forming by applying pressure while heating. The above-mentioned laminating and forming can be carried out by applying heat and pressure with use of, for example, a multi-stage vacuum press, a double belt, or the like.

Since prepreg 1 and metal-clad laminate 11 are formed with use of resin composition 2 for a printed wiring board, as described above, they have small CTE, and moreover, favorable formability. Therefore, prepreg 1 is less likely to cause warp, and also less likely to cause separation (resin separation) between the resin component and the inorganic filler (b). Therefore, prepreg 1 can be used effectively as a substrate material for fabricating a high-performance printed wiring board. Metal-clad laminate 11 can be used for manufacture of a printed wiring board with use of a subtractive method, and is used in preferred manner, in particular, for manufacture of a printed wiring board with use of a semi-additive method.

[Printed Wiring Board]

Figure 3:
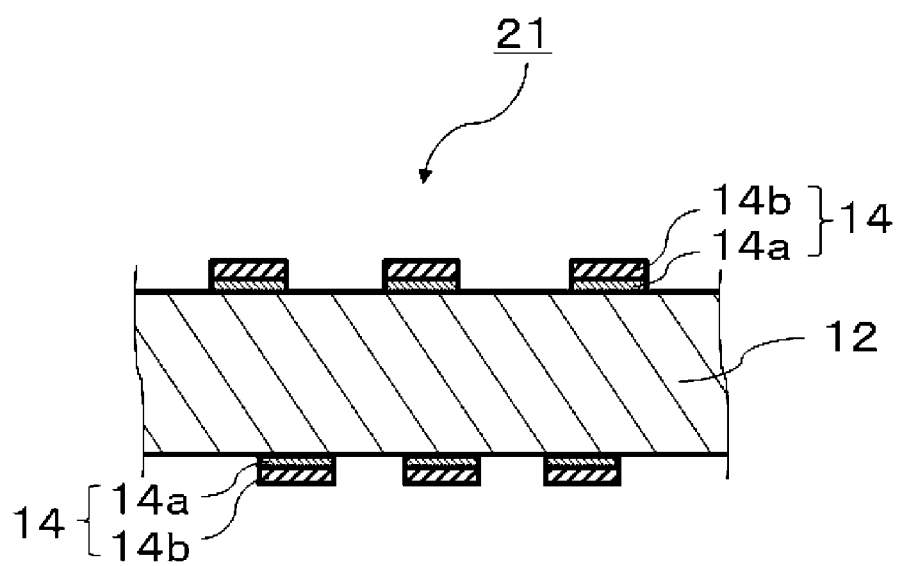
FIG. 3 is a schematic sectional view illustrating a printed wiring board according to an exemplary embodiment.

FIG. 3 is a schematic sectional view illustrating a printed wiring board according to an exemplary embodiment. Printed wiring board 21 includes insulating layer 12 composed of a cured product of prepreg 1, and circuit patterns 14 formed on one or both surfaces of insulating layer 12, circuit patterns 14 each composing of electroless plating layer 14a and electrolytic plating layer 14b formed on electroless plating layer 14a. More specifically, an example of printed wiring board 21 includes printed wiring board 21 (hereinafter, may be referred to as a core substrate) composed of insulating layer 12 and circuit patterns 14 disposed on one or both surfaces of insulating layer 12. Another example of printed wiring board 21 includes a multilayer printed wiring board configured to have an insulating layer (hereinafter, may be referred to as an interlayer insulating layer) and an inner-layer conductor pattern (hereinafter, may be referred to as an inner-layer circuit pattern) formed alternately on a surface of the core substrate with circuit patterns 14 disposed, and have circuit pattern 14 formed as an outermost layer.

A line width of each of circuit patterns 14 is not particularly limited, but preferably ranges from 2 µm to 30 µm, inclusive, more preferably from 2 µm to 15 µm, inclusive. In addition, a line space between circuit patterns 14 is not particularly limited, but preferably ranges from 2 µm to 30 µm, inclusive, more preferably from 2 µm to 15 µm, inclusive.

A thickness of each of circuit patterns 14 is not particularly limited, but preferably ranges from 10 µm to 35 µm inclusive. In addition, a thickness of electroless plating layer 14a is not particularly limited, but preferably ranges from 0.5 µm to 1.0 µm, inclusive. As long as the thickness of electroless plating layer 14a falls within the range mentioned above, use of a semi-additive method makes it possible to form circuit patterns 14 with lower L/S, which is a ratio of a line width (L) of each of circuit patterns 14 to a space (S) between circuit patterns 14. In addition, electrolytic plating layer 14b can be easily formed, electroless plating layer 14a can be formed in a short period of time, and production efficiency can be thus improved. Furthermore, when a surface of insulating layer 12 has microscopic irregular geometry, electroless plating layer 14a is formed to follow surface geometry of insulating layer 12 as a base for electroless plating layer 14a, and adhesion between electroless plating layer 14a and electrolytic plating layer 14b can be thus further enhanced.

The present exemplary embodiment is, because insulating layer 12 is formed with use of resin composition 2 for a printed wiring board, excellent in hygroscopicity and heat resistance, and also high in adhesion to fine circuit patterns obtained through use of a semi-additive method. Therefore, the exemplary embodiment is used in a preferred manner as a high-density printed wiring board required for achievement of reduction in thickness and size for an electronic device.

In addition, a package such as a Finepitch Ball Grid Array (FBGA) can be manufactured by mounting a semiconductor element on printed wiring board 21, and sealing the resulting product. In addition, a package such as a Package on Package (PoP) can be manufactured by stacking a plurality of subpackages with use of the foregoing package as a subpackage.

[Method for Manufacturing Printed Wiring Board]

A method for manufacturing printed wiring board 21 according to the present exemplary embodiment includes, for example, a step (A) of preparing a substrate for a printed wiring board; a step (B) of forming, on a surface of insulating layer 12, electroless plating layer 14a by electroless plating; a step (C) of forming a resist mask with an opening on electroless plating layer 14a; a step (D) of forming electrolytic plating layer 14b by electrolytic plating in the opening mentioned above; a step (E) of removing the resist mask mentioned above; and a step (F) of selectively removing, by etching, a part of electroless plating layer 14a that has no overlap with electrolytic plating layer 14b in a planar view.

(Step (A))

In the step (A), a substrate for a printed wiring board is prepared.

The substrate for a printed wiring board may be any substrate as long as circuit patterns 14 can be formed by a semi-additive method on a surface composed of a cured product of resin composition 2 for a printed wiring board. Examples of the substrate include a core substrate composed of insulating layer 12 or the like, and a multi-layered substrate with an inner-layer circuit pattern coated with an interlayer insulating layer.

For example, by a plating through-hole method, a build-up method, or the like, a laminated body in the course of multi-layer wiring with an inner-layer circuit pattern laminated on a core substrate with the above-mentioned interlayer insulating layer interposed therebetween with the interlayer insulating layer laminated on an outermost surface can be used as the multi-layered substrate.

The inner-layer circuit pattern may be formed by a conventionally known circuit formation method. In addition, in the case of forming circuit patterns 14 on both surfaces of the core substrate, through holes may be formed by, for example, drilling, laser processing, or the like in order to electrically connect circuit patterns 14 formed on the both surfaces of the core substrate. In this case, the steps (B) and (D) described later can form through-hole plating to electrically connect the circuit patterns formed on the both surfaces of the core substrate.

(Step (B))

In the step (B), on the surface of insulating layer 12, electroless plating layer 14a (seed layer) is formed by electroless plating.

The electroless plating can be carried out by a known method such as a chemical plating method of bringing an electrolytic solution (plating solution) including ions of metal for plating, into contact with a surface of an object to be plated, with a catalyst such as palladium attached thereto. For example, electroless copper plating is carried out as the electroless plating.

(Step (C))

In the step (C), the resist mask with an opening is formed on electroless plating layer 14a. The resist mask masks a region of electroless plating layer 14a where circuit patterns 14 are not to be formed. More specifically, the inside of the opening of the resist mask serves as a region where circuit patterns 14 are to be formed.

The resist mask is not particularly limited, and known materials can be used such as a photosensitive dry film.

In the case of using a photosensitive dry film as the resist mask, first, the photosensitive dry film is laminated on electroless plating layer 14a. Then, a part of the photosensitive dry film, which is located in the region where circuit patterns 14 are not to be formed, is exposed for light curing. Then, an unexposed part of the photosensitive dry film is dissolved and removed with a developer. In this regard, the cured photosensitive dry film remaining on electroless plating layer 14a serves as a resist mask.

(Step (D))

In the step (D), in the opening, electrolytic plating layer 14b is formed by electrolytic plating. The electrolytic plating can be carried out by a known method such as immersing an object to be plated in a plating solution and electrifying with electroless plating layer 14a as a power feeding layer electrode.

(Step (E))

In the step (E), the resist mask is removed. The resist mask can be removed by a known method.

(Step (F))

In the step (F), a part of electroless plating layer 14a that has no overlap with electrolytic plating layer 14b in a planar view is selectively removed by etching. More specifically, electroless plating layer 14a (seed layer) located in the region where circuit patterns 14 are not to be formed is removed. Thus, circuit patterns 14 are to be formed on the substrate for a printed wiring board. It is noted that the seed layer can be removed by a known method such as local etching by splaying or the like an etching solution such as sodium persulfate.

EXAMPLES

Hereinafter, the present disclosure is more specifically described with reference to examples.

Examples 1 to 12 and Comparative Examples 1 to 15

A thermosetting resin (a), an inorganic filler (b), a thermoplastic resin (c) soluble in an organic solvent, and a thermoplastic resin (d) insoluble in an organic solvent shown below were prepared, and raw materials of the components were mixed further with an organic solvent to reach blending amounts (parts by mass) shown in Tables 1 and 2, thereby preparing resin compositions for printed wiring boards in the form of varnish (hereinafter, referred to as a resin varnish) such that a non-volatile content (solid content) is 70 mass %. Here are details of the respective raw materials.

<Thermosetting Resin (a)>

Epoxy resin ("EPPN-502H from Nippon Kayaku Co., Ltd.")

Phenol resin ("TD-209060M from DIC Corporation")

Phenol resin ("GPH-103" from Nippon Kayaku Co., Ltd.)

<Inorganic Filler (b)>

Epoxysilane-treated silica (particle size: 0.5 μm, "SC-2500SEJ" from Admatechs Company Limited)

<Thermoplastic Resin (c) Soluble in Organic Solvent>

Copolymer of acrylic monomer ("SG-P3Mw1" from Nagase ChemteX Corporation, epoxy-modified product)

Copolymer of acrylic monomer ("SG-80H" from Nagase ChemteX Corporation, epoxy-amide-modified product)

Ethylene-acrylic rubber ("Vamac (registered trademark) G" from DuPont)

<Thermoplastic Resin (d) Insoluble in Organic Solvent>

Core-shell rubber with a graft layer as a shell part around a core part composed of silicone-acrylic composite rubber (particle size: 1.0 μm, "SRK200A", "S-2001" from Mitsubishi Rayon Co., Ltd.)

Core-shell rubber with, as a shell part, a polymer layer higher in Tg than a core part composed of a copolymer of acrylic monomer (particle size: 0.5 μm, "AC-3816", "AC-3355" from Aica Kogyo Co., Ltd.)

<Organic Solvent>

Methyl Ethyl Ketone

Glass clothes (thickness: 95 μm, "2116" from Nitto Boseki Co., Ltd.) as a fabric were impregnated with the resin varnishes prepared in accordance with the blend compositions in Tables 1 and 2 so as to reach 100 μm in thickness after curing, and dried by heating at 130° C. for 3 minutes until reaching a semi-cured state. Thus, prepregs were obtained which were approximately 47 mass % in varnish solid content in the prepregs.

[Adhesion]

Two of the prepregs mentioned above were stacked, and copper foil (thickness: 2 μm, "MT-FL" from Mitsui Mining And Smelting Company, Limited) as metal foil was laminated on both surfaces of the stacked prepreg, and the resulting product was formed by heating at 210° C. for 120 minutes while applying pressure at 4.1 MPa. Thus, a both-side copper-clad laminate (thickness: 0.2 mm) with the copper foil on both surfaces of a cured product (hereinafter, may be referred to as an insulating layer) of the prepregs was obtained.

Then, the copper foil on both surfaces was removed with use of a chloride etching solution, thereby providing an insulating layer. The resulting insulating layer was immersed in each of primary, secondary, and tertiary water washing tanks of ion-exchange water for 30 seconds, washed with water, then immersed for 5 minutes in a palladium-tin colloid-type "AT-105 activating solution" (from C.Uyemura & Co., Ltd.) at 25° C. to provide a catalyst, further washed with water, and subjected to an acceleration treatment at 25° C. for 3 minutes with use of a THRU-CUP AL-106 accelerator (from C.Uyemura & Co., Ltd.). Then, the insulating layer was washed with water, and then swingingly immersed at 36° C., a bath load of 0.4 dm$^2$/l, and a deposition rate of 2.0 μm/hr for 30 minutes in an electroless copper plating solution ("PEA Ver. 3" from C.Uyemura & Co., Ltd.). Thus, an insulating layer with an evenly and homogeneously lustered electroless copper plating layer (thickness: 1 μm, hereinafter referred to as a seed layer) on both surfaces of the insulating layer (hereinafter, referred to as an insulating layer with a seed layer) was obtained. Then, an electrolytic copper plating layer was formed on the seed layer by electrolytic copper plating ("COPPER GLEAM ST901-C" from Dow Electronic Materials) under a condition of 2 A/dm$^2$ for 79 minutes, thereby providing an insulating layer with copper plating including a conductor layer of 35 μm in thickness on both surfaces of the insulating layer.

A plating peel strength was measured for a plating peel strength measurement site (width×length=10 mm×150 mm) with use of the resulting insulating layer with copper plating. The plating peel strength was measured in conformity with JISC 6481. The measurement results are shown in Tables 1 and 2. The plating peel strength of 0.45 kN/m or more was evaluated as "VG", the strength of 0.40 kN/m or more and less than 0.45 kN/m was evaluated as "OK", and the strength of less than 0.40 kN/m was evaluated as "NG".

[Hygroscopic Heat Resistance]

In the same way as the "Adhesion" mentioned above, an insulating layer with copper plating was obtained. In conformity with JISC 6481 5.5, a sample was fabricated with use of the resulting insulating layer with copper plating, and subjected to a pressure cooker test (PCT) treatment under conditions of 121° C., 100% RH, and 5 hours. Next, the sample subjected to the PCT treatment was immersed for 1 minute in a solder bath at 260° C., and whether the treated sample had any bulge generated or not was confirmed.

The sample immersed in the solder bath for 1 minute was evaluated as "OK" when it was not possible to confirm the generation of any bulge, or evaluated as "NG" when it was possible to confirm the generation of bulge.

[Formability]

The surface of the insulating layer with the copper foil removed from the both-side copper-clad laminate in the "Adhesion" mentioned above was visually observed for the generation of seams and unevenness, thereby confirming the presence or absence of resin separation. The surface without resin separation generated was evaluated as "OK", and the surface with resin separation generated was evaluated as "NG".

TABLE 1

| Blending condition and physical properties evaluation | | | | | | | | | |
|---|---|---|---|---|---|---|---|---|---|
| | Product name | Raw material name | Unit | Example 1 | Example 2 | Example 3 | Example 4 | Example 5 | Example 6 |
| Thermosetting resin (a) | EPPN-502H | Epoxy resin | parts by mass | 61 | 61 | 61 | 61 | 61 | 61 |
| | TD-2090 60M | Phenolic resin | parts by mass | 39 | 39 | 39 | 39 | 39 | 39 |
| | GPH-103 | Phenolic resin | parts by mass | — | — | — | — | — | — |
| | Total content ratio | | parts by mass | 100 | 100 | 100 | 100 | 100 | 100 |
| Inorganic filler (b) | SC-2500SEJ | Silica | parts by mass | 50 | 50 | 50 | 50 | 50 | 50 |

TABLE 1-continued

| | | | | | | | | | |
|---|---|---|---|---|---|---|---|---|---|
| Thermoplastic resin (c) soluble in organic solvent | SG-P3 Mw.1 | Copolymer of acrylic monomer | parts by mass | 6 | 14 | 15 | 35 | — | 35 |
| | SG-80H | Copolymer of acrylic monomer | parts by mass | — | — | — | — | 35 | — |
| | Vamac G | Ethylene-acrylic rubber | parts by mass | — | — | — | — | — | — |
| Thermoplastic resin (d) insoluble in organic solvent | SRK200A | Core-shell rubber | parts by mass | 14 | 6 | 35 | 15 | 15 | — |
| | S-2001 | Core-shell rubber | parts by mass | — | — | — | — | — | 15 |
| | AC-3816 | Core-shell rubber | parts by mass | — | — | — | — | — | — |
| | AC-3355 | Core-shell rubber | parts by mass | — | — | — | — | — | — |
| | Total content ratio of thermoplastic resins (c) and (d) | | parts by mass | 20 | 20 | 50 | 50 | 50 | 50 |
| | Adhesion (plating peel strength) | | kN/m — | 0.42 OK | 0.45 VG | 0.47 VG | 0.59 VG | 0.65 VG | 0.60 VG |
| | Hygroscopic heat resistance | | — | OK | OK | OK | OK | OK | OK |
| | Formability | | — | OK | OK | OK | OK | OK | OK |

Blending condition and physical properties evaluation

| | Product name | Raw material name | Unit | Example 7 | Example 8 | Example 9 | Example 10 | Example 11 | Example 12 |
|---|---|---|---|---|---|---|---|---|---|
| Thermosetting resin (a) | EPPN-502H | Epoxy resin | parts by mass | 61 | 57 | 61 | 61 | 61 | 61 |
| | TD-2090 60M | Phenolic resin | parts by mass | 39 | — | 39 | 39 | 39 | 39 |
| | GPH-103 | Phenolic resin | parts by mass | — | 43 | — | — | — | — |
| | Total content ratio | | parts by mass | 100 | 100 | 100 | 100 | 100 | 100 |
| Inorganic filler (b) | SC-2500SEJ | Silica | parts by mass | 50 | 50 | 150 | 150 | 150 | 50 |
| Thermoplastic resin (c) soluble in organic solvent | SG-P3 Mw.1 | Copolymer of acrylic monomer | parts by mass | 35 | 35 | 35 | 14 | 35 | 12 |
| | SG-80H | Copolymer of acrylic monomer | parts by mass | — | — | — | — | — | — |
| | Vamac G | Ethylene-acrylic rubber | parts by mass | — | — | — | — | — | — |
| Thermoplastic resin (d) insoluble in organic solvent | SRK200A | Core-shell rubber | parts by mass | — | — | 15 | 6 | — | 8 |
| | S-2001 | Core-shell rubber | parts by mass | — | — | — | — | — | — |
| | AC-3816 | Core-shell rubber | parts by mass | 15 | — | — | — | 15 | — |
| | AC-3355 | Core-shell rubber | parts by mass | — | 15 | — | — | — | — |
| | Total content ratio of thermoplastic resins (c) and (d) | | parts by mass | 50 | 50 | 50 | 20 | 50 | 20 |

TABLE 1-continued

|  | | | | | | | |
|---|---|---|---|---|---|---|---|
| Adhesion (plating peel strength) | kN/m | 0.64 | 0.63 | 0.46 | 0.40 | 0.48 | 0.44 |
|  | — | VG | VG | VG | OK | VG | OK |
| Hygroscopic heat resistance | — | OK | OK | OK | OK | OK | OK |
| Formability | — | OK | OK | OK | OK | OK | OK |

TABLE 2

| Blending condition and physical properties evaluation | | | | | | | | |
|---|---|---|---|---|---|---|---|---|
|  | Product name | Raw material name | Unit | Comparative Example 1 | Comparative Example 2 | Comparative Example 3 | Comparative Example 4 | Comparative Example 5 |
| Thermosetting resin (a) | EPPN-502H | Epoxy resin | parts by mass | 61 | 57 | 61 | 61 | 61 |
|  | TD-2090 60M | Phenolic resin | parts by mass | 39 | — | 39 | 39 | 39 |
|  | GPH-103 | Phenolic resin | parts by mass | — | 43 | — | — | — |
|  | Total content ratio | | parts by mass | 100 | 100 | 100 | 100 | 100 |
| Inorganic filler (b) | SC-2500SEJ | Silica | parts by mass | — | — | — | — | — |
| Thermoplastic resin (c) soluble in organic solvent | SG-P3 Mw. 1 | Copolymer of acrylic monomer | parts by mass | — | — | 30 | — | — |
|  | SG-80H | Copolymer of acrylic monomer | parts by mass | — | — | — | 30 | — |
|  | Vamac G | Ethylene-acrylic rubber | parts by mass | — | — | — | — | 30 |
| Thermoplastic resin (d) insoluble in organic solvent | SRK200A | Core-shell rubber | parts by mass | — | — | — | — | — |
|  | S-2001 | Core-shell rubber | parts by mass | — | — | — | — | — |
|  | AC-3816 | Core-shell rubber | parts by mass | — | — | — | — | — |
|  | AC-3355 | Core-shell rubber | parts by mass | — | — | — | — | — |
| Total content ratio of thermoplastic resins (c) and (d) | | | parts by mass | 0 | 0 | 30 | 30 | 30 |
| Adhesion (plating peel strength) | | | kN/m | 0.17 | 0.28 | 0.62 | 0.68 | 0.45 |
|  | | | — | NG | NG | VG | VG | VG |
| Hygroscopic heat resistance | | | — | NG | NG | NG | NG | NG |
| Formability | | | — | OK | OK | OK | OK | NG |

| Blending condition and physical properties evaluation | | | | | | | | |
|---|---|---|---|---|---|---|---|---|
|  | Product name | Raw material name | Unit | Comparative Example 6 | Comparative Example 7 | Comparative Example 8 | Comparative Example 9 | Comparative Example 10 |
| Thermosetting resin (a) | EPPN-502H | Epoxy resin | parts by mass | 61 | 61 | 61 | 61 | 61 |
|  | TD-2090 60M | Phenolic resin | parts by mass | 39 | 39 | 39 | 39 | 39 |

TABLE 2-continued

| | Product name | Raw material name | Unit | | | | | |
|---|---|---|---|---|---|---|---|---|
| | GPH-103 | Phenolic resin | parts by mass | — | — | — | — | — |
| | Total content ratio | | parts by mass | 100 | 100 | 100 | 100 | 100 |
| Inorganic filler (b) | SC-2500SEJ | Silica | parts by mass | — | — | — | — | 250 |
| Thermoplastic resin (c) soluble in organic solvent | SG-P3 Mw. 1 | Copolymer of acrylic monomer | parts by mass | — | — | — | — | 6 |
| | SG-80H | Copolymer of acrylic monomer | parts by mass | — | — | — | — | — |
| | Vamac G | Ethylene-acrylic rubber | parts by mass | — | — | — | — | — |
| Thermoplastic resin (d) insoluble in organic solvent | SRK200A | Core-shell rubber | parts by mass | 30 | — | — | — | 14 |
| | S-2001 | Core-shell rubber | parts by mass | — | 30 | — | — | — |
| | AC-3816 | Core-shell rubber | parts by mass | — | — | 30 | — | — |
| | AC-3355 | Core-shell rubber | parts by mass | — | — | — | 30 | — |
| Total content ratio of thermoplastic resins (c) and (d) | | | parts by mass | 30 | 30 | 30 | 30 | 20 |
| Adhesion (plating peel strength) | | | kN/m | 0.18 NG | 0.17 NG | 0.28 NG | 0.27 NG | 0.17 NG |
| Hygroscopic heat resistance | | | — | OK | OK | OK | OK | OK |
| Formability | | | — | OK | OK | OK | OK | OK |

Blending condition and physical properties evaluation

| | Product name | Raw material name | Unit | Comparative Example 11 | Comparative Example 12 | Comparative Example 13 | Comparative Example 14 | Comparative Example 15 |
|---|---|---|---|---|---|---|---|---|
| Thermosetting resin (a) | EPPN-502H | Epoxy resin | parts by mass | 61 | 61 | 61 | 61 | 61 |
| | TD-2090 60M | Phenolic resin | parts by mass | 39 | 39 | 39 | 39 | 39 |
| | GPH-103 | Phenolic resin | parts by mass | — | — | — | — | — |
| | Total content ratio | | parts by mass | 100 | 100 | 100 | 100 | 100 |
| Inorganic filler (b) | SC-2500SEJ | Silica | parts by mass | 250 | 250 | 50 | 50 | 30 |
| Thermoplastic resin (c) soluble in organic solvent | SG-P3 Mw. 1 | Copolymer of acrylic monomer | parts by mass | 15 | 35 | 10 | 36 | 14 |
| | SG-80H | Copolymer of acrylic monomer | parts by mass | — | — | — | — | — |
| | Vamac G | Ethylene-acrylic rubber | parts by mass | — | — | — | — | — |
| Thermoplastic resin (d) insoluble in organic solvent | SRK200A | Core-shell rubber | parts by mass | 35 | 15 | 5 | 24 | 6 |
| | S-2001 | Core-shell rubber | parts by mass | — | — | — | — | — |

TABLE 2-continued

|  |  |  |  |  |  |  |  |
|---|---|---|---|---|---|---|---|
| AC-3816 | Core-shell rubber | parts by mass | — | — | — | — | — |
| AC-3355 | Core-shell rubber | parts by mass | — | — | — | — | — |
| Total content ratio of thermoplastic resins (c) and (d) | | parts by mass | 50 | 50 | 15 | 60 | 20 |
| Adhesion (plating peel strength) | | kN/m | 0.21 | 0.32 | 0.35 | 0.61 | 0.47 |
|  |  | — | NG | NG | NG | VG | VG |
| Hygroscopic heat resistance | | — | OK | OK | OK | OK | NG |
| Formability | | — | OK | OK | OK | NG | OK |

In each of Examples 1 to 12, the resin composition for a printed wiring board includes the thermosetting resin (a), the inorganic filler (b), the thermoplastic resin (c) soluble in an organic solvent, and the thermoplastic resin (d) insoluble in an organic solvent, and as for the respective content ratios of the thermosetting resin (a), the inorganic filler (b), the thermoplastic resin (c), and the thermoplastic resin (d), with respect to 100 parts by mass of the thermosetting resin (a), a content ratio of the inorganic filler (b) ranges from 50 parts by mass to 150 parts by mass, inclusive, and a total content ratio of the thermoplastic resin (c) and the thermoplastic resin (d) ranges from 20 parts by mass to 50 parts by mass, inclusive. Thus, the adhesion, the hygroscopic heat resistance, and the formability were all evaluated as "VG" or "OK".

In contrast, in each of Comparative Examples 1, 2, the resin composition for a printed wiring board fails to include the inorganic filler (b), the thermoplastic resin (c), and the thermoplastic resin (d). Thus, the adhesion and the hygroscopic heat resistance were evaluated as "NG".

In each of Comparative Examples 3, 4, 5, the resin composition for a printed wiring board fails to include the inorganic filler (b) and the thermoplastic resin (d). Thus, the hygroscopic heat resistance was evaluated as "NG". In Comparative Example 5, the resin composition for a printed wiring board includes ethylene-acrylic rubber ("Vamac G") as the thermoplastic resin (c). Thus, the formability was evaluated as "NG".

In each of Comparative Examples 6, 7, 8, 9, the resin composition for a printed wiring board fails to include the inorganic filler (b) and the thermoplastic resin (c). Thus, the adhesion was evaluated as "NG".

In each of Comparative Examples 10, 11, 12, the content ratio of the inorganic filler (b) exceed 150 parts by mass with respect to 100 parts by mass of the thermosetting resin (a). Thus, the adhesion was evaluated as "NG".

In Comparative Example 13, a total content ratio of the thermoplastic resin (c) and the thermoplastic resin (d) is less than 20 parts by mass with respect to 100 parts by mass of the thermosetting resin (a). Thus, the adhesion was evaluated as "NG".

In Comparative Example 14, a total content ratio of the thermoplastic resin (c) and the thermoplastic resin (d) exceeds 50 parts by mass with respect to 100 parts by mass of the thermosetting resin (a). Thus, the formability was evaluated as "NG".

In Comparative Example 15, the content ratio of the inorganic filler (b) is less than 50 parts by mass with respect to 100 parts by mass of the thermosetting resin (a). Thus, the hygroscopic heat resistance was evaluated as "NG".

In addition, when Examples 4, 9 are compared with Comparative Example 12, it was confirmed that the plating peel strength tends to be lower as the content ratio of the inorganic filler (b) is increased.

When Comparative Examples 1, 3 to 9 are compared, it was found that inclusion of the thermoplastic resin (c) can improve the plating peel strength.

The prepreg, metal-clad laminate, and printed wiring board according to the present disclosure are useful in, for example, wiring boards used for various types of high-integrated electronic devices.

The invention claimed is:

1. A prepreg comprising:
a woven fabric base; and
a semi-cured product of a resin composition, the semi-cured product filling an inside of the woven fabric base and coating a surface of the woven fabric base, wherein:
the resin composition includes: a thermosetting resin; an inorganic filler; a first thermoplastic resin soluble in an organic solvent; and a second thermoplastic resin insoluble in an organic solvent,
with respect to 100 parts by mass of the thermosetting resin, a content ratio of the inorganic filler ranges from 50 parts by mass to 150 parts by mass, inclusive, and a total content ratio of the first thermoplastic resin and the second thermoplastic resin ranges from 20 parts by mass to 50 parts by mass, inclusive,
a content ratio of the first thermoplastic resin to the second thermoplastic resin is in a range from 30:70 to 70:30, inclusive, expressed by a mass ratio of the first thermoplastic resin to the second thermoplastic resin.

2. The prepreg according to claim 1, wherein:
the first thermoplastic resin is a copolymer of an acrylic monomer, and
the second thermoplastic resin is a core-shell rubber.

3. The prepreg according to claim 1, wherein the inorganic filler is at least one selected from a group consisting of silica, alumina, and boehmite.

4. A metal-clad laminate comprising:
an insulating layer including a cured product of the prepreg according to claim 1; and
a metal foil disposed at least one surface of the insulating layer.

5. A printed wiring board comprising:
an insulating layer including a cured product of the prepreg according to claim 1; and
a circuit pattern disposed on at least one surface of the insulating layer, the circuit pattern including an electroless plating layer and an electrolytic plating layer formed on the electroless plating layer.

* * * * *